(12) United States Patent
Ando et al.

(10) Patent No.: US 6,513,563 B1
(45) Date of Patent: Feb. 4, 2003

(54) COMPONENT FEEDING METHOD AND DEVICE

(75) Inventors: Takashi Ando, Kofu (JP); Teruo Kawaguchi, Nakakoma-gun (JP); Yuji Nagasawa, Nakakoma-gun (JP); Shuuichi Kubota, Nakakoma-gun (JP); Mamoru Inoue, Hirakata (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/341,807

(22) PCT Filed: Jan. 19, 1998

(86) PCT No.: PCT/JP98/00188

§ 371 (c)(1),
(2), (4) Date: Sep. 30, 1999

(87) PCT Pub. No.: WO98/32316

PCT Pub. Date: Jul. 23, 1998

(30) Foreign Application Priority Data

Jan. 20, 1997 (JP) ............................................. 9-007306

(51) Int. Cl.⁷ ............................ B65H 5/28; H05K 13/02
(52) U.S. Cl. ...................... 156/538; 156/584; 156/556; 226/122; 221/25; 414/411
(58) Field of Search ................................ 156/541, 584, 156/556, 344, 538, 539; 226/122, 159, 164; 221/25, 72, 73, 79, 87; 414/411, 416, 425

(56) References Cited

U.S. PATENT DOCUMENTS

| | | | | |
|---|---|---|---|---|
| 4,437,129 A | * | 3/1984 | Yoshida et al. | 360/85 |
| 5,342,474 A | * | 8/1994 | Mohara et al. | 156/584 |
| 5,725,140 A | * | 3/1998 | Weber et al. | 226/128 |
| 5,865,359 A | * | 2/1999 | Kanai | 226/122 |
| 6,199,614 B1 | * | 3/2001 | Snyder et al. | 156/387 |

FOREIGN PATENT DOCUMENTS

| | | | | |
|---|---|---|---|---|
| EP | 838991 A1 | * | 4/1998 | H05K/13/02 |
| JP | 02010895 A | * | 1/1990 | H05K/13/02 |
| JP | 4-30500 | | 2/1992 | |
| JP | 5-90786 | | 4/1993 | |
| JP | 5-125284 | | 6/1993 | |
| JP | 5-335785 | | 12/1993 | |
| JP | 07038286 A | * | 2/1995 | H05K/13/02 |
| JP | 09186487 A | * | 7/1997 | H05K/13/02 |
| JP | 11054989 A | * | 2/1999 | H05K/13/02 |

* cited by examiner

*Primary Examiner*—Richard Crispino
*Assistant Examiner*—Sue A. Purvis

(57) ABSTRACT

A component feeding apparatus for pitch-feeding taping components (1) to a component feed position (30), peeling a cover tape (1b) short of the component feed position (30) and taking out and feeding a component (5) from an accommodation portion (1c) at the component feed position (30), wherein the component is supplied stably in an appropriate posture to the component feed position (30). A slit (36) is formed in a shutter (35) capable of moving between a position at which the upper surface of the taping component (1) is covered and a position at which the component feed position is opened so that a cover tape (1b) peeled from the taping component (1) can be passed through the slit (36) and can be pulled up, and the peeling step of the cover tape (1b) and the pitch-feeding step of the taping component (1) can be separated from each other to prevent the component (5) from greatly moving and assuming an irregular posture inside the accommodation portion (1c).

8 Claims, 10 Drawing Sheets

(a)

(b)

COMPONENT FEEDING METHOD AND DEVICE

TECHNICAL FIELD

The present invention relates to component feeding method and device, and more particularly to component feeding method and device wherein a component carrying tape, that is constituted by a tapelike member having spaces formed at a predetermined pitch in a lengthwise direction of the tapelike member for accommodating components therein and a cover tape for covering the components, is fed at the predetermined pitch along a component feeding guide towards a component feeding position. The cover tape is peeled off just before the component feeding position so that components are taken out and supplied.

BACKGROUND ART

A conventional component feeding device B is described with reference to FIG. 13 and FIG. 14. Reference numeral 1 represents a component carrying tape, which is fed at a predetermined pitch along the upper side of a component feeding guide 2 towards a component feeding position. At the distal end on its top of the component feeding guide 2 is mounted a holding cover 3, which is provided with an opening 4 such as to correspond to the component feeding position and a slit 6 formed by cutting the holding cover from one side at a point before the component feeding position. The cover tape 1b of the component carrying tape 1 is drawn out from this slit 6 thereby being peeled off from the tapelike member 1a, and is further wound up around a take-up reel 7. The tapelike member 1a is thus fed to the component feeding position in a state that its accommodating spaces 1c are exposed, but thanks to the holding cover 3 being above the accommodating spaces 1c, the components 5 within the accommodating spaces 1c are stably supplied to the component feeding opening 4 without jumping out therefrom. A shutter 8 is provided on the holding cover 3 which opens and closes the component feeding opening 4 concurrently with the component feeding operation, and the construction is such that the component 5 can be taken out in an appropriate attitude by opening the shutter 8 only when a suction nozzle 10 is going to pick up the component 5.

In FIG. 13, reference numerals 14, 15 and 16 respectively represent a tape reel around which the component carrying tape 1 is wound, a reel support shaft, and a feed wheel disposed at the distal end of the component feeding guide 2. 17 is a support shaft, around which the take-up reel 7 is rotatably supported and around which a feed lever 20 is supported such as to be rockable. A rocking movement of the feed lever 20 in a direction shown by arrow D causes the shutter 8 to move backwards thereby revealing the component feeding opening and allowing the component 5 to be taken out, and the return rock of the feed lever 20 causes the take-up reel 7 to rotate in a direction shown by arrow C by the function of a ratchet mechanism 19 comprising a ratchet wheel 18, thereby to take up the cover tape 1b and simultaneously to drive the feed wheel 16 to rotate by means of a link/lever mechanism 22 and a ratchet mechanism 23 for the pitch feed of the component carrying tape 1. A pair of guide pins 24 support the shutter 8 such as to be movable and elongated holes 24a are formed in the shutter 8 to-which the guide pins 24 fit in. Link/lever mechanism 22 comprises a link 25 and a rocking lever 26, and is constructed such that a pin 27 provided at the distal end of the rocking lever 26 engages with a notch 24b formed by cutting off the shutter 8.

In the conventional component feeding device B described above, however, the construction is such that, by the returning rocking movement of the feed lever 20, the cover tape 1b is peeled off from the tapelike member 1a as shown by arrow c at the same time when the component carrying tape 1 is moved in a direction shown by arrow a while the shutter 8 moves in a direction shown by arrow b thereby covering the component feeding opening 4 as shown in FIG. 14, i.e., the peeling off of the cover tape 1b and the pitch feed of the component carrying tape 1 occur simultaneously. There was thus a problem that the component 5 in the accommodating space 1c is displaced and may even stand up upon the shock generated by the above two actions, and as the attitude of the components 5 becomes irregular, the component 5 positioned at the component feeding opening 4 may not be picked up by the suction nozzle 10 in an appropriate attitude, as a result of which a mounting failure occurs.

In view of the above problem in the prior art, an object of the present invention is to provide a component feeding method and device by which components can be supplied in an appropriate attitude towards a component feeding position.

DISCLOSURE OF THE INVENTION

The present invention provides a component feeding method wherein a component carrying tape constituted by a tapelike member having accommodating spaces formed at a predetermined pitch in a lengthwise direction of the tapelike member for accommodating components therein, the components being covered by a cover tape, is fed at a predetermined pitch and the cover tape is peeled off before a component feeding position, whereby a component is taken out from the accommodating space thereof and fed at the component feeding position, characterized by having processes of: opening a shutter that covers the upper surface of the component carrying tape at the component feeding position when the component carrying tape is paused and at the same time peeling off the cover tape; taking out the component and feeding the same; and closing the shutter and at the same time feeding the component carrying tape at the predetermined pitch. Since the process of peeling off the cover tape and the pitch feed process of component carrying tape are separated, it is prevented that the component within the accommodating space is greatly displaced causing its attitude to become irregular due to vibration upon the peeling off of the cover tape coupled with the vibration upon the pitch feed of the component carrying tape, whereby it is ensured that the component is picked up in an appropriate attitude and thus a highly reliable mounting operation can be realized.

The present invention also provides a component feeding apparatus wherein a component carrying tape constituted by a tapelike member having accommodating spaces formed at a predetermined pitch in a lengthwise direction of the tapelike member for accommodating components therein, the components being covered by a cover tape, is fed at a predetermined pitch and the cover tape is peeled off before a component feeding position, whereby a component is taken out from the accommodating space thereof and fed at the component feeding position, characterized by having: a shutter movable between a position where it covers the upper surface of the component carrying tape at the component feeding position and a position where it opens the component feeding position, the shutter being provided with a slit through which the cover tape peeled off from the component carrying tape is passed and drawn out; and peeling-off and taking-up means for pulling the cover tape drawn out through the slit so as to peel off the cover tape from the component carrying tape and for winding up the peeled-off cover tape. By forming a slit in the shutter for peeling off the cover tape, the cover tape can be peeled off in synchronism with the opening movement of the shutter separately from the pitch feed process of the component carrying tape. The above method can be thereby implemented using a conventional basic construction of the pitch feed and peeling off mechanism and their driving means.

Furthermore, by providing a magnet for magnetically attracting the component in the component feeding guide between the area where the cover tape is peeled off and the vicinity of the component feeding position, the component can be held to the bottom of the accommodating space at the time of pitch-feeding the component carrying tape or peeling off the cover tape, and it is ensured that the component is fed in an appropriate attitude.

By providing a construction wherein the peeling-off and taking-up means comprise a take-up reel around which the cover tape is wound up at the same time when a feed lever rocks in one direction, said feed lever being adapted to cause the component carrying tape to be fed at a pitch and the shutter to open and close by a reciprocating rocking movement thereof, and a rocking draw-out lever which rocks with the rocking movement of the feed lever the function of a link, the rocking draw-out lever being adapted to pull up the cover tape hooked over a pair of fixed rollers in cooperation with these fixed rollers when rocking in one direction, and to let out the cover tape towards the shutter side when rocking in the opposite direction, the cover tape can be peeled off simultaneously when the shutter is opened and the component carrying tape can be fed at the pitch in synchronism with the closing movement of the shutter with a simple construction wherein the rocking draw-out lever is added, and thus peeling off of the cover tape and pitch-feeding of the tape can be separately achieved while using the structure of a conventional component feeding device.

If the shutter is provided with a dry type lubricating layer on sliding surfaces thereof, abrasion or scorching can be prevented even under a high-speed operation, and also even if the shutter directly contacts with the component carrying tape, there is no risk that the lubricating agent adheres to any of tapelike member, cover tape, or component whereby lubricating effect will be decreased or the component will be contaminated.

Furthermore, by setting the distance between the top surface of the component feeding guide and the shutter at the portion on the side of the component feeding position with respect to the slit smaller substantially by the thickness of the cover tape than the distance between the top surface of the component feeding guide and the shutter at the portion on the opposite side of the component feeding position with respect to the slit, the gap between the tapelike member from which the cover tape has been peeled off and the shutter can be made nearly zero, whereby the attitude of components can be certainly restricted with the shutter thus preventing it from becoming irregular.

By further providing a feed lever that is capable of rocking in a reciprocating way for the pitch feed of the component carrying tape and for causing the shutter to open and close, a feed wheel that rotates in cooperation with returning rocking movement of the feed lever by engagement with feed holes formed in the component carrying tape for feeding the component carrying tape at the pitch, and a rocking lever that rocks in a reciprocating way in cooperation with the reciprocating rocking movement of the feed lever to open and close the shutter, wherein the radius of rotation of the engaged portion between the feed wheel and the feed holes is determined substantially the same as the radius of rotation of the engaged portion between the rocking lever and the shutter, the speed of pitch-feeding of the component carrying tape can be made the same as the speed of closing movement of the shutter whereby their actions can be completely synchronized, and it is prevented that the shutter opens on its way allowing the component to jump up, or that the cover tape enters the under side of the shutter.

Also, by further providing a rockable feed lever, a rocking lever which rocks in cooperation with rocking movements of the feed lever, a feed wheel having a feed toothed wheel that engages with feed holes formed in the component carrying tape and a drive toothed wheel uniformly provided to the feed toothed wheel and engaged with a ratchet mechanism provided to the rocking lever so that rotation drive force of the rocking lever is transmitted in only one direction to the drive toothed wheel of the feed wheel, a first back stop lever engaged with the drive toothed wheel such as to restrict rotation in the other direction of the feed wheel when the feed lever rocks in one direction, and a second back stop lever engaged with the drive toothed wheel of the feed wheel such as to provide a rotation drive force to the drive toothed wheel in the other direction thereby to position the feed wheel at a position where the feed wheel comes to a halt, the feed wheel can be rotated and stopped precisely at the predetermined pitch even under a high-speed operation with the tensile force from the cover tape being wound up, and the accuracy of the position where the component carrying tape comes to a halt can be ensured.

Also, by further providing a push-up pin provided at the component feeding position for pushing up from below the component in the accommodating space of the component carrying tape, wherein the push-up pin is formed with a flat surface at the upper end thereof of a diameter to a degree that it is capable of piercing through the bottom surface of the accommodating space of the component carrying tape, there will be no such inconveniences that the accuracy in push-up position is lowered because of worn-out tip of the push-up pin thus causing unstable component pick-up operation, the component is chipped by a sharpened tip of the push-up pin, or the component is displaced when being pushed up thus causing pick-up failure.

Furthermore, the present invention provides a component feeding apparatus wherein a component carrying tape constituted by a tapelike member having accommodating spaces formed at a predetermined pitch in a lengthwise direction of the tapelike member for accommodating components therein, the components being covered by a cover tape, is fed at a predetermined pitch and the cover tape is peeled off before a component feeding position, whereby a component is taken out from the accommodating space thereof and fed at the component feeding position, characterized by having a plurality of component feeding guides disposed in parallel, a covering member provided to each of the component feeding guides for holding and guiding the component carrying tape towards the component feeding position, said covering member being formed with a slit through which the cover tape peeled off from the component carrying tape is passed and drawn out, and a plurality of peeling-off and taking-up means for pulling the cover tape drawn out from each of the slits so as to peel off the cover tape from the component carrying tape and for winding up the peeled off cover tape, wherein open ends of the slits are formed outwardly. With such an arrangement, more types of components can be loaded in a smaller space thus facilitating manufacture of various types of products, and also, since the moving pitch of different types of components is made smaller, the speed of operation can be increased. Moreover, since, when loading a component carrying tape to one of the component feeding guide, the other component feeding guide or its holding member do not obstruct such loading operation, loading of the component carrying tape can be accomplished simply in a short time, whereby production efficiency is enhanced.

BEST MODE FOR CARRYING OUT THE INVENTION

Figure 1:
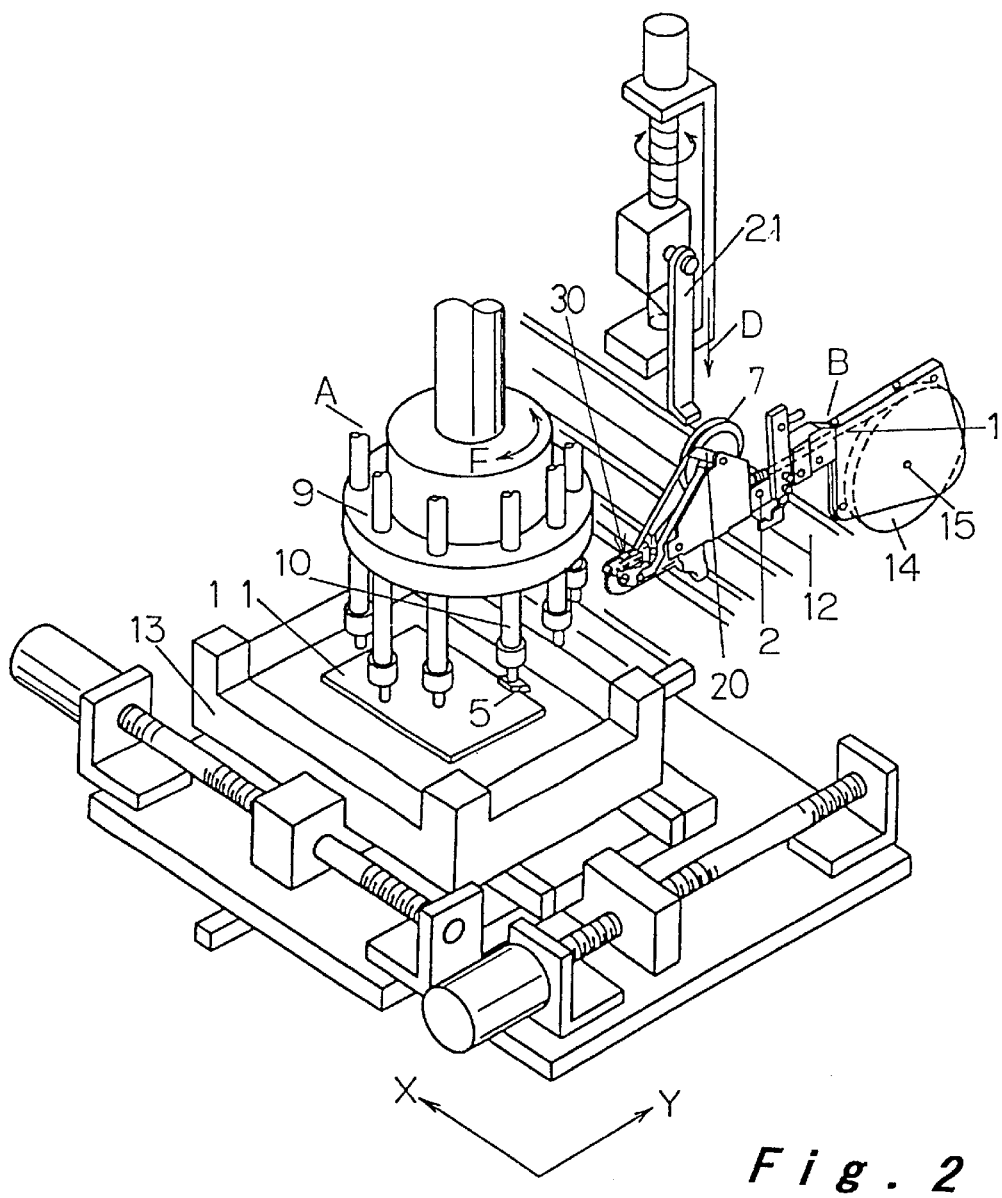
FIG. 1 is a perspective view showing an electronic component mounting apparatus in which the component feeding device according to one embodiment of the present invention is adapted.

The component feeding device according to one embodiment of the present invention will be hereinafter described with reference to FIG. 1 to FIG. 11.

The component feeding device B in this embodiment is adapted for use in an electronic component mounting apparatus A wherein electronic components are installed on a printed board 11. A number of component feeding devices B corresponding to the number of types of components 5 required in the mounting apparatus A are mounted on a component feeding table 12 disposed on the backside of the mounting apparatus A, and one component feeding device B which is accommodating components 5 of the type desired to be mounted is moved to a position where it faces the mounting apparatus A. The component 5 supplied to a component feeding position is picked up by a suction nozzle 10 equipped to a mounting head 9 of the mounting apparatus A, and installed on the printed board 11. The printed board 11 is placed on an X-Y table 13 that is movable in two, X and Y, directions orthogonal to each other and is subject to the position control in these two, X and Y, directions, thereby enabling the component 5 that has been picked up and transferred to a mounting position by the suction nozzle 10 to be installed in a predetermined position on the printed board 11. It should be noted that the suction nozzle 10, instead of the printed board 11, may be moved in X and Y directions in order for the component 5 to be mounted in a predetermined position on the printed board 11.

Figure 2:
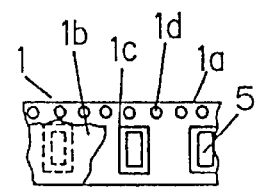
FIG. 2 is a plan view showing a component carrying tape in the embodiment.

Component carrying tape 1 is set in the component feeding device B in the form of a tape wound around a reel 14. The component carrying tape 1 is constructed as shown in FIG. 2 such that components 5 are accommodated in recesses (accommodating space) 1c that are formed at a predetermined pitch in a lengthwise direction of the tapelike member 1a, and the upper side of the components 5 is covered with a cover tape 1b; a series of feed holes 1d are formed at a certain pitch distance on one side of the tapelike member 1a.

Figure 13:
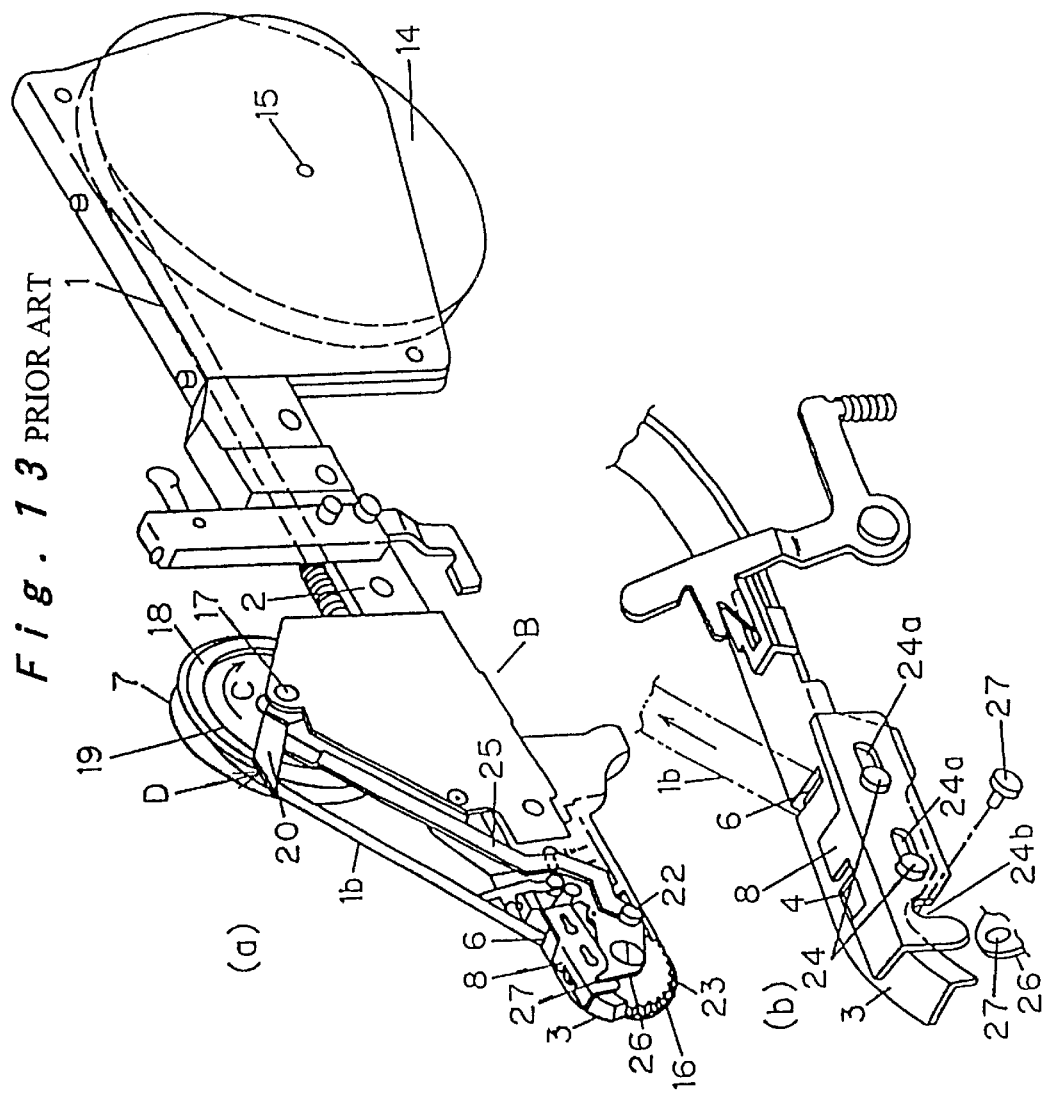
FIG. 13 is a perspective view showing the whole of a prior art component feeding device in (a) and the detail of major parts thereof in (b)
Figure 14:
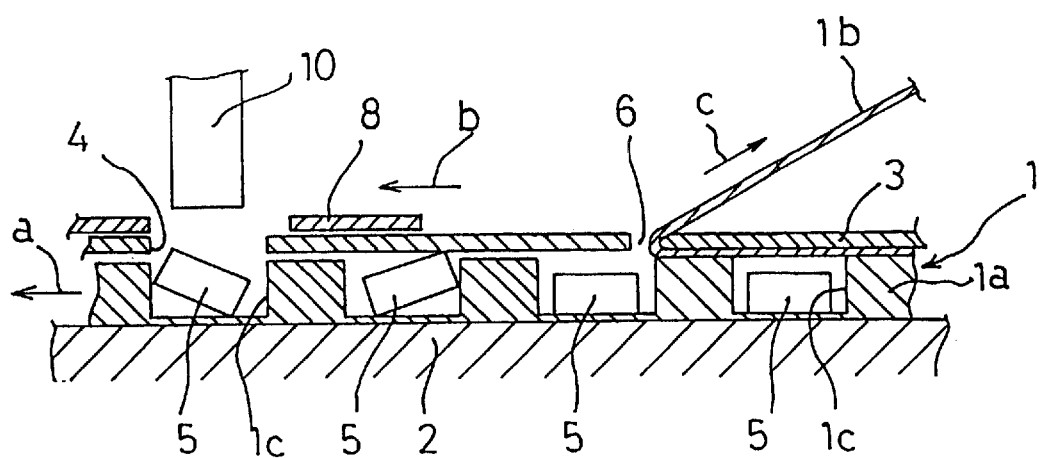
FIG. 14 is a cross-sectional view given in explanation of problems in the prior art component feeding device.

The construction of the component feeding device B is shown in FIG. 3 through FIG. 11. Elements having substantially the same functions as those of the prior art described with reference to FIG. 13 are given the same reference numerals and will be described no more in detail. The component feeding guide 2 which guides the component carrying tape 1 towards the component feeding position 30 is provided with a holding cover 31 on the top of its distal end.

Figure 3:
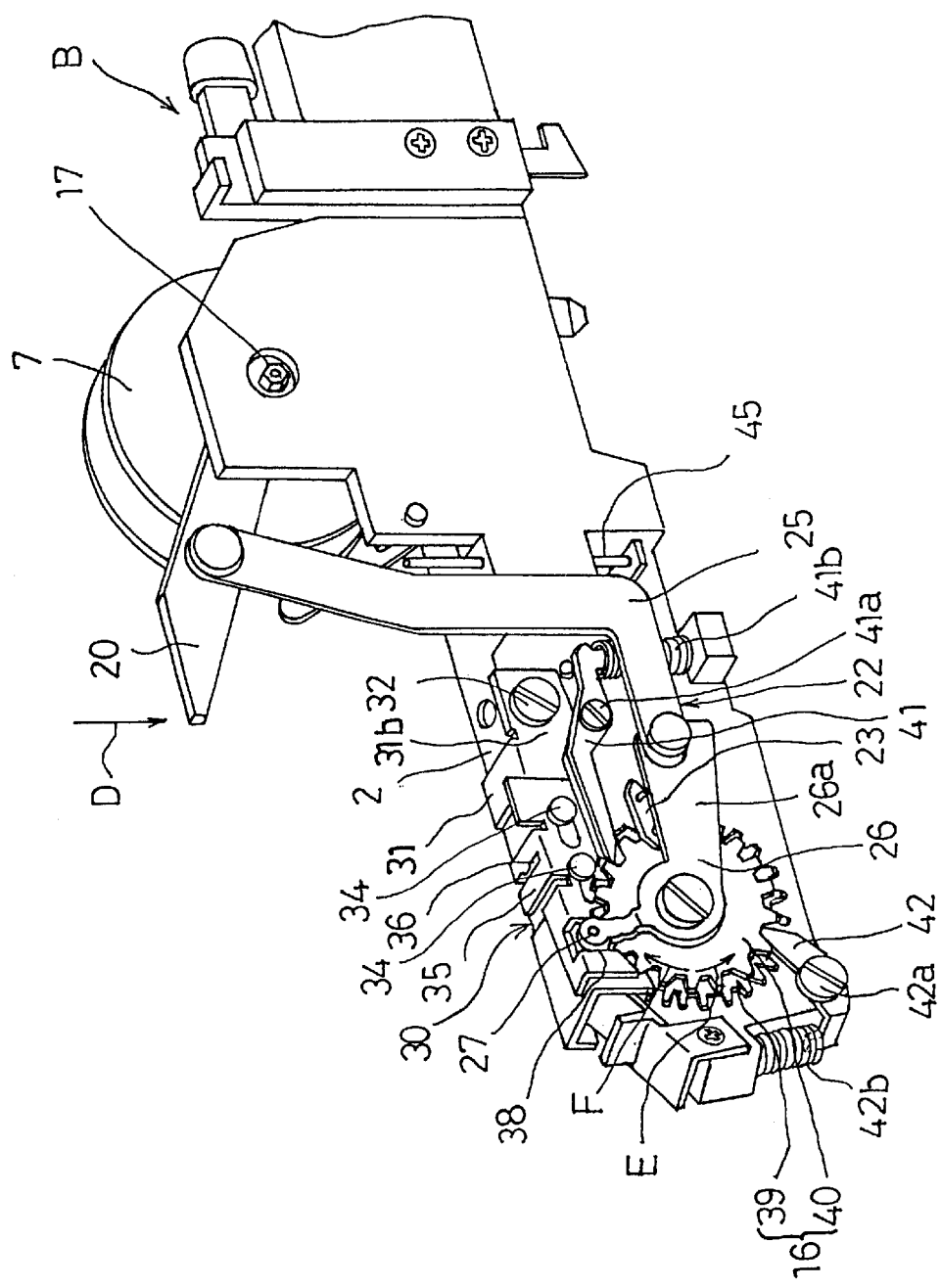
FIG. 3 is a perspective view showing major parts of the component feeding device in the embodiment seen from the front side.
Figure 4:
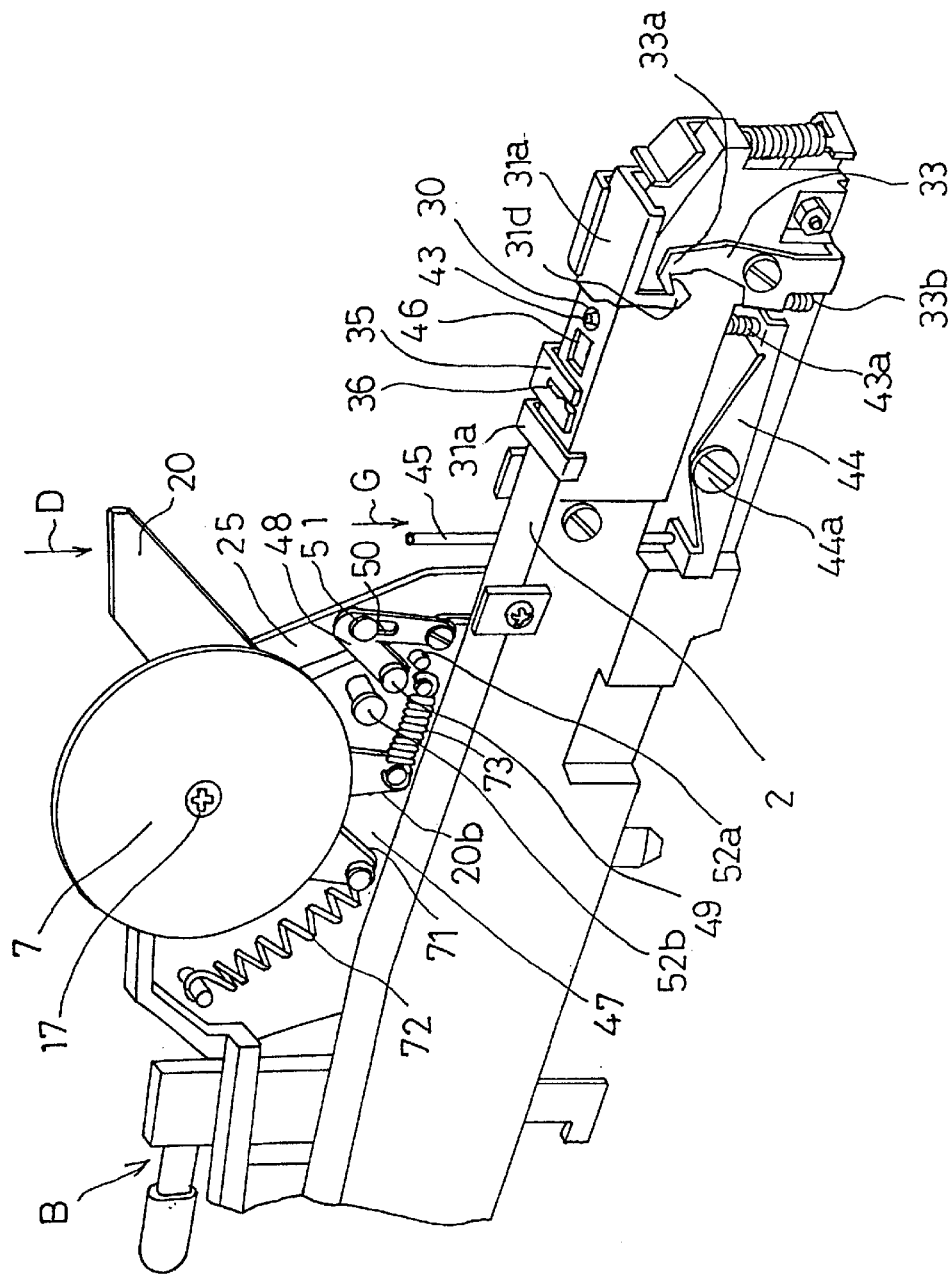
FIG. 4 is a perspective view showing major parts of the component feeding device in the embodiment seen from the back side.
Figure 7:
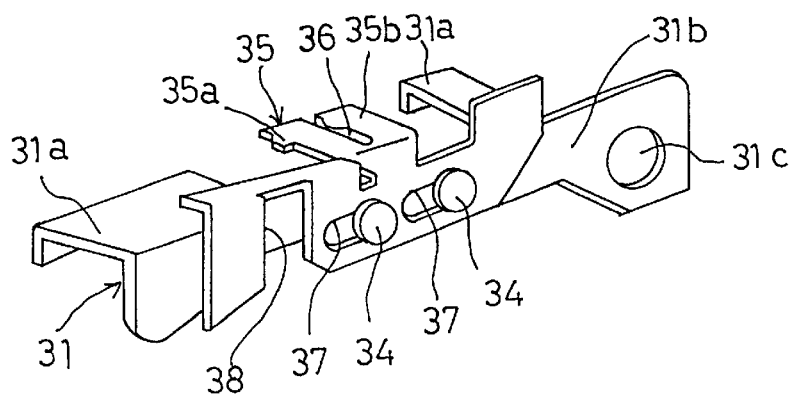
FIG. 7 is a perspective view showing a holding cover and a shutter in the embodiment.

This holding cover 31 comprises a covering portion 31a that faces the top surface of the component feeding guide 2 except an area in the vicinity of the component feeding position 30 and the successive area in an appropriate range as shown in FIG. 3, FIG. 4, and FIG. 7. The holding cover 31 is mounted to one side of the component feeding guide 2 by a pivot pin 32 on one side wall 31b at the rear end thereof such as to be rockable upwards and downwards. The pivot pin 32 is mounted through a hole 31c shown in FIG. 7. At the distal end of the holding cover 31 on the opposite side with respect to the side wall 31b, a locking hook 31d is formed to extend downwards as shown in FIG. 4, which is engaged with a hook 33a and is thereby locked, the hook 33a being provided to the distal end of a locking lever 33 which is mounted rockably to the other side of the component feeding guide 2 with respect to the side to which the holding cover 31 is mounted. The locking lever 33 is biased towards the locking direction with a spring 33b.

Figure 8:
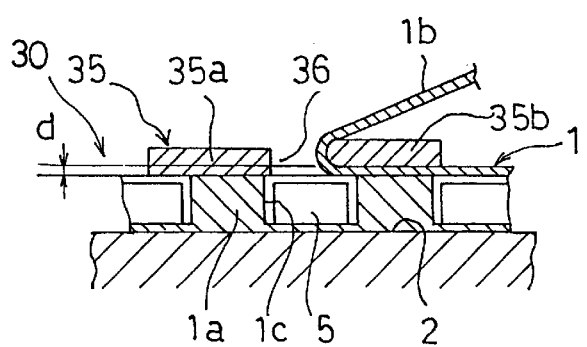
FIG. 8 is a detailed cross-sectional view of the shutter in the embodiment.

A pair of guide pins 34 are provided on one side wall 31b of the holding cover 31, with which a shutter 35 is mounted thereto such as to be movable between a position covering the upper side of the component feeding position 30 and a position retracted backwards therefrom. The shutter 35 comprises a covering portion 35a for covering the upper side of the tapelike member 1a of the component carrying tape 1 from which the cover tape 1b has been peeled off at the position above the component feeding position 30 and at the backwardly retracted position, a guide portion 35b for holding and guiding the upper side of the component carrying tape 1 before the cover tape 1b is peeled off, and a slit 36 formed by cutting into the shutter 35 from one side so as to allow the cover tape 1b to be drawn out to the outside between the above two 35a, 35b, as shown in FIG. 7 and FIG. 8. The distance between the covering portion 35a and the top surface of the component feeding guide 2 is set smaller by an amount d which is substantially equal to the thickness of the cover tape 1b than the distance between the guide portion 35b and the top surface of the component feeding guide 2. 37 represents elongated holes formed in the shutter 35 in which the guide pins 34 fit, and 38 is a notch with which the pin 27 at the tip of the rocking lever 26 engages.

On the surfaces of the shutter 35 in sliding contact with the holding cover 31 and the component carrying tape 1, a dry type lubricating layer is formed by burning a dry type grease thereinto so that no abrasion or scorching occurs even if they are slid with each other at a high speed, and that the shutter 35, even in the event of contacting the component carrying tape 1 directly, does not adhere to its tapelike member 1a, cover tape 1b, or the component 5.

Figure 9:
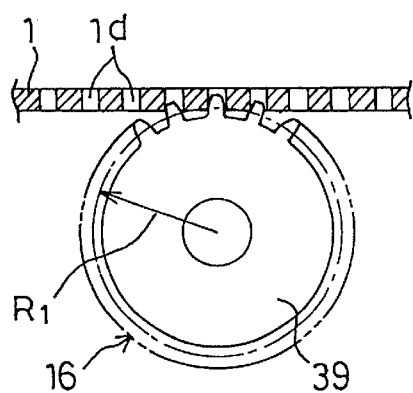
FIG. 9 is a diagram given in explanation of the dimensional relationship between a feed toothed wheel and a rocking lever in the embodiment in (a) and (b)
Figure 9:
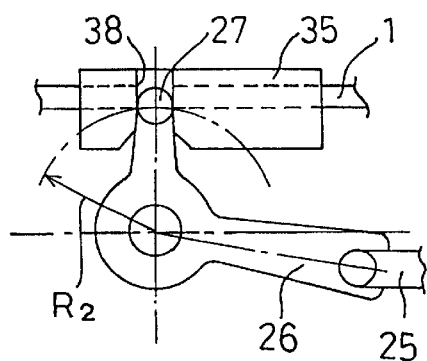
Figure 10:
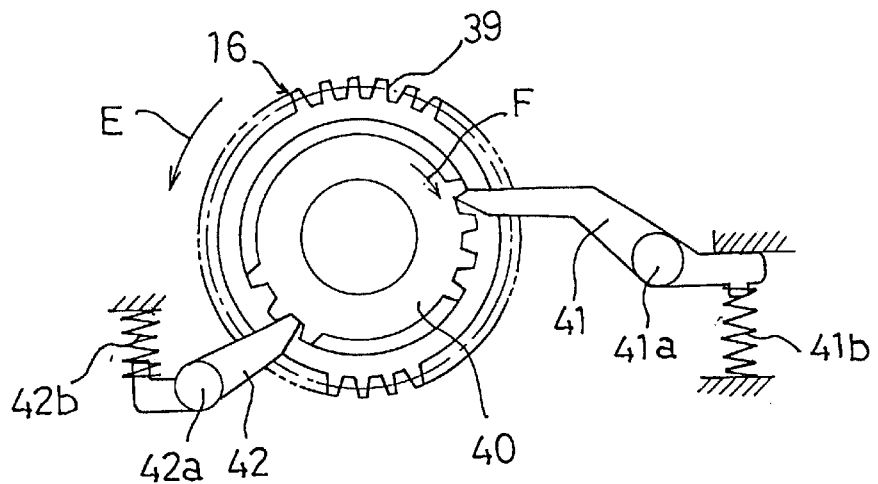
FIG. 10 is a detailed view of a first and a second back stop levers in the embodiment.

The rocking lever 26 is supported rockably on the component feeding guide 2 coaxially with the feed wheel 16. The feed wheel 16 comprises a feed toothed wheel 39 that engages with the feed holes 1d of the component carrying tape and feeds the component carrying tape 1 at the pitch by its intermittent rotation, and a drive toothed wheel 40 provided uniformly with the feed toothed wheel 39, as shown in FIG. 3, FIG. 9, and FIG. 10. Referring to FIG. 9, the pitch radius R1 of the feed toothed wheel 39 is set substantially identical to the rocking radius R2 of the pin 27 at the distal end of the rocking lever 26. The speed and the feed of the component carrying tape 1 thus respectively correspond to the moving speed and distance of the shutter 35, thereby to cause the component carrying tape 1 and the shutter 35 to move in synchronism, so that the recesses 1c of the component carrying tape 1 are certainly covered by the covering portion 35a of the shutter 35 thus preventing the component 5 from standing up, and that the cover tape 1b is prevented from entering the gap under the cover portion 35a.

Interposed between the drive toothed wheel 40 of the feed wheel 16 and a base 26a of the rocking lever 26 is a ratchet mechanism 23, by which the drive toothed wheel 40 is driven to rotate in the direction of arrow E when the rocking lever 26 rocks back by the returning rocking movement of the feed lever 20 through the link 25 in a direction opposite to the direction of arrow D as shown in FIG. 3. When the feed lever 20 rocks in the direction of D, the rocking lever 26 rotates in a direction of F opposite to the direction of E as shown in FIG. 3 and FIG. 10, but at this time the ratchet mechanism 23 idles and does not transmit a drive force to the drive toothed wheel 40. Nevertheless since the ratchet mechanism 23 and the drive toothed wheel 40 are in frictional contact with each other, there is a risk that the drive toothed wheel 40 rotates with the rotation of the rocking lever 26 in the direction of arrow F. In order to prevent such rotation of the drive toothed wheel 40 with the rocking lever 26, a first back stop lever 41 is provided such as to engage with a tooth of the drive toothed wheel 40. Furthermore, a second back stop lever 42 is provided, which also engages with a tooth of the drive toothed wheel 40 and urges the same towards the direction of arrow F, so as to ensure the engagement between the first back stop lever 41 and the tooth of the drive toothed wheel 40 thereby to position them precisely at a predetermined position. With the first and second back stop levers 41, 42 as described above, even during a high-speed operation under a condition wherein a tensile force is worked on the cover tape 1b, it is ensured that the feed wheel 16 is rotated and stopped precisely at the predetermined pitch thereby to ensure the accuracy of the stopping position of the component carrying tape 1. These first and second back stop levers 41, 42 are pivotally supported at their intermediate parts with their respective support shafts 41a, 42a, and further provided with springs 41b, 42b interposed between their other ends and the component feeding guide 2, such as to urge the respective levers to rock. The construction is such that when the drive toothed wheel 40 is rotated in the direction of arrow E, the first and the second back stop levers 41, 42 rock against the force of the springs 41b, 42b.

Figure 5:
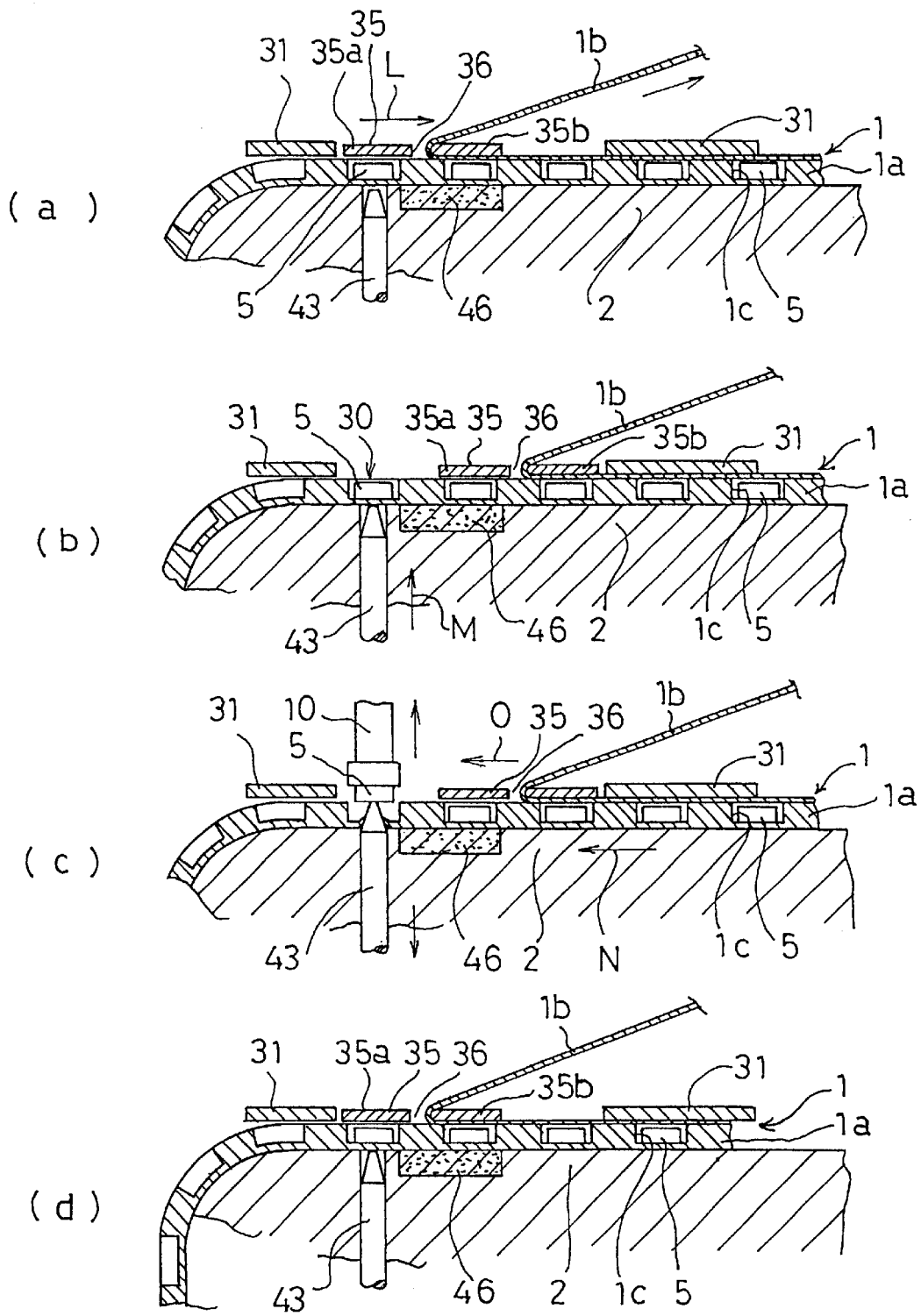
FIG. 5 is a cross-sectional view showing the process of component feeding operation in the embodiment in sequence from (a) to (d)
Figure 11:
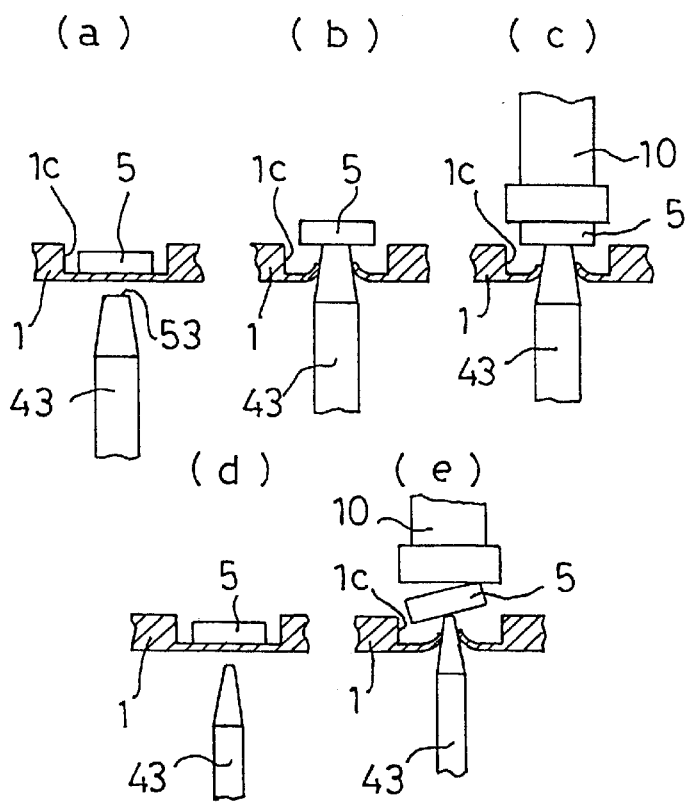
FIG. 11 is a diagram showing the action of a push-up pin in the embodiment from (a) to (c) and that of the prior art in (d) and (e)

At the component feeding position 30 of the component feeding guide 2, as shown in FIG. 4 and FIG. 5, a push-up pin 43 is provided that is disposed such as to be movable upwards and downwards and is urged downwards by a spring 43a for pushing up the component 5 in the recess 1c of the component carrying tape 1 when the component is picked up by the suction nozzle 10. The lower end of the push-up pin 43 is in contact with one end of a push-up lever 44 that is supported at its middle portion by a support shaft 44a so as to allow free rocking movement. A press-down shaft 45 is provided to the component feeding guide 2 such as to be movable upwards and downwards, of which lower end is in contact with the other end of the push-up lever 44. With this construction, a component 5 can be pushed up by the push-up pin 43 by pressing down the upper end of the press-down shaft 45 that projects above the component feeding guide 2 in the direction of arrow G. The push-up pin 43 has at its upper end a flat surface 53 of which diameter is approximately 0.4 mm, for example, to a degree that it is capable of piercing through the bottom surface of the recess 1c of the component carrying tape 1, as shown in detail in FIG. 11, whereby the push-up pin 43 under a waiting condition shown in (a) thrusts up the component 5 by piercing through the bottom surface of the recess 1c as shown in (b), so that the component 5 is picked up as shown in (c). The upper end of the push-up pin 43 is formed to be a flat surface 53 as described above, thus avoiding inconveniences such as unstableness in component sucking operation or chipping of components due to lowered accuracy of pushing up position because of worn out tip of the push-up pin in the case of forming the tip in a pointed shape as shown in FIG. 11(d), or component pick-up failure because of inappropriate attitude of the component 5 pushed up as shown in FIG. 11(e).

Furthermore, a magnet 46 is provided to a part of or the whole area ranging from the vicinity of the component feeding position 30 to the area where the cover tape 1b is peeled off through the slit 36 of the shutter 35 as shown in FIG. 4 and FIG. 5, so that the component 5, magnetically attracted to the magnet 46, is held still on the bottom of the recess 1c when the cover tape 1b is peeled off and when the component carrying tape 1 is fed at a pitch thus being supplied certainly in an appropriate attitude. Such magnetic attraction of the component 5 does not affect the picking up action of the suction nozzle 10 in any way, since the component 5 is pushed up by the push-up pin 43 at the component feeding position 30.

Figure 6:
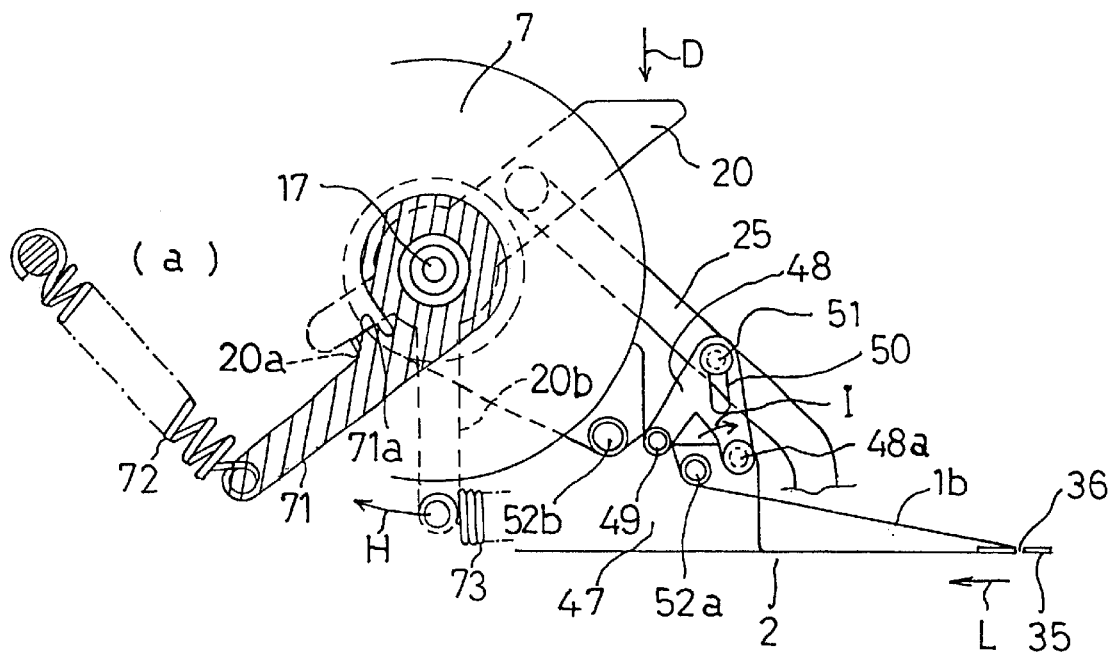
FIG. 6 is a diagram given in explanation of the cover tape winding up action in the embodiment in (a) and (b)
Figure 6:
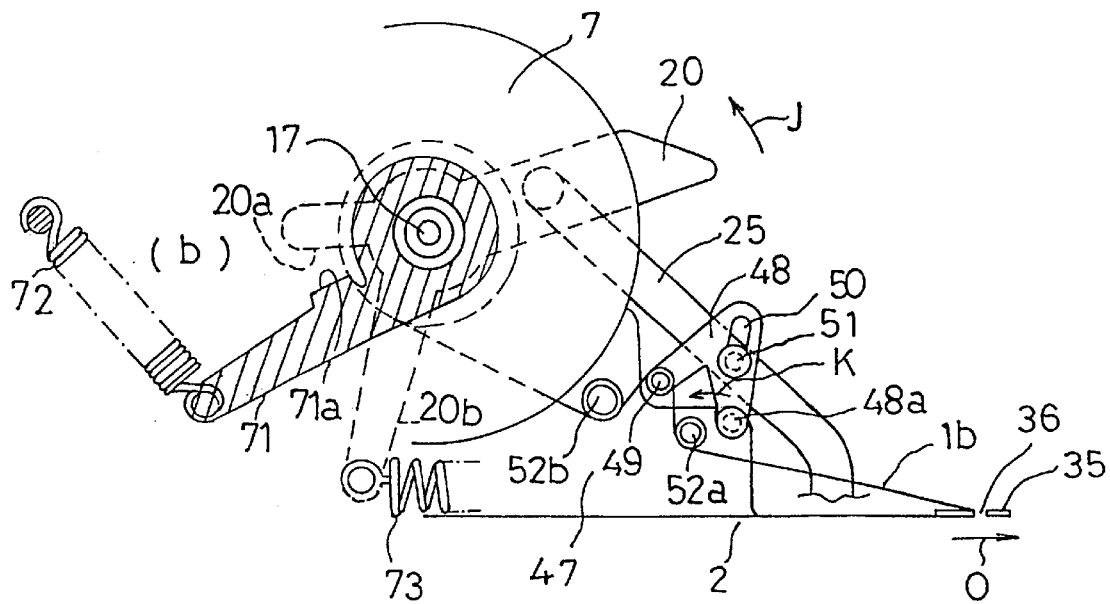

The cover tape 1b drawn out through the slit 36 of the shutter 35 is wound up on the take-up reel 7 rotatably supported around the support shaft 17, which is fixed on a support plate 47 disposed upright in the middle part of the component feeding guide 2 as shown in FIG. 4 and FIG. 6.

A rocking draw-out lever 48 substantially in the form of an inverted letter V is supported at its one end around a pivot pin 48a to be freely rockable at the front end of the support plate 47. The rocking draw-out lever 48 has at the other end thereof a rocking roller 49 for hooking the cover tape 1b therearound and an elongated hole 50 formed in the middle part in which is fit an engaging pin 51 provided at a middle point of the link 25 that connects the feed lever 20 and the rocking lever 26, so that the rocking draw-out lever 48 rocks between positions shown in (a) and (b) of FIG. 6 as the feed lever 20 rocks forwards and backwards. The rocking roller 49 is flanked by a pair of fixed rollers 52a, 52b provided on the support plate 47 and the cover tape 1b drawn out through the slit 36 is hooked over the fixed roller 52a, rocking roller 49, and fixed roller 52b, and wound around the take-up reel 7 so that it is wound up when the reel is rotated in the direction of arrow H upon pressing down of the feed lever 20 in the direction of D.

The cover tape 1b is wound up around the take-up reel 7 when the feed lever 20 rocks in the direction of D by the length corresponding to the feeding pitch of the component carrying tape 1. The specific construction thereof is shown in FIG. 4 and FIG. 6. On the support shaft 17 supporting the take-up reel 7, a take-up lever 71 is rotatably supported. Between this take-up lever 71 and the take-up reel 70 is interposed a one-way clutch (not shown), whereby rotation of the take-up lever 71 is transmitted to the take-up reel 7 only when the lever rotates in the direction in which the cover tape is wound up shown by arrow H in FIG. 6(a). Reverse rotation of the take-up reel 7 in the direction shown by arrow J in FIG. 6(b) is restricted, and therefore, when the take-up lever 71 rotates in the direction of arrow J, it rotates freely with respect to the take-up reel 7 and the take-up reel 7 stays still. The take-up lever 71 is urged by a spring 72 towards the direction of arrow H. The feed lever 20 has an extension piece 20b stretching downwards, and is urged by a spring 73 engaged with the distal end of the extension piece 20b in the direction of arrow J. Both of the feed lever 20 and the take-up lever 71 are formed with respective contact surfaces 20a, 71a that come into contact with and apart from each other.

When the feed lever 20 rocks in the direction of arrow D against the force of the spring 73 as shown in FIG. 6(a), the contact surface 20a of the feed lever 20 also moves in the same direction (direction of arrow H). The take-up lever 71, since it is urged by the spring 72 in the direction of arrow H, also rotates in the direction of H following the feed lever 20. This rotation is transmitted to the take-up reel 7 through the one-way clutch so as to cause the take-up reel 7 to rotate in the direction of arrow H, thereby taking up the cover tape 1b. When the cover tape 1b by the length corresponding to the feed pitch of the component carrying tape 1 is wound up around the take-up reel 7, the take-up reel 7 stops its rotation due to the tensile force from the cover tape 1b, upon which the take-up lever 71 is also paused at the position where it is. The feed lever 20 further rotates in the direction of arrow H after that, causing its contact surface 20a to come apart from the contact surface 71a of the take-up lever 71 as shown in FIG. 6(b), and stops when it reaches a lower dead point in the direction of arrow D. The position where the take-up lever 71 comes to a halt varies depending on the diameter of the reel of cover tape 1b wound up around the take-up reel 7.

Return rotation of the feed lever 20 in the direction of arrow J is accomplished by the urging force of the spring 73. As the feed lever 20 rotates back in the direction of arrow J, its contact surface 20a comes into contact with the contact surface 71a of the take-up lever 71, whereby the take-up lever 71 rotates together with the feed lever 20 against the force of the spring 72 in the direction of arrow J. This rotation of the take-up lever 71 is not transmitted to the take-up reel 7, and the take-up reel 7 remains still. When the feed lever 20 returns to its upper dead point, the take-up lever 71 also reaches its initial position shown in FIG. 6(a).

Next, the whole action of component feeding performed in the above component feeding device B will be described. After a given one of component feeding devices B has been brought to a component supplying position as shown in FIG. 1, a press-down means 21 disposed thereabove is activated thereby to press down and rock the feed lever 20 in the direction of arrow D shown in FIG. 1, FIG. 3, and FIG. 4. This is accompanied by a rocking movement of the rocking lever 26 through the link 25, which causes the shutter 35, through the engagement between the pin 27 at the distal end of the rocking lever 26 and the notch 38 of the shutter 35, to move backwards in the direction of arrow L from the state shown in (a) to the state shown in (b) of FIG. 5, thus opening the upper part of the component feeding position 30. The rocking movement of the feed lever 20 pressed downwards in the direction of D, at the same time, is accompanied by the rotation of the take-up lever 71 in the direction of arrow H as shown in FIG. 6, and the take-up reel 7 is driven to rotate in the direction of arrow H by this rotation of the take-up lever 71. The cover tape 1b is peeled off from the component carrying tape 1 which is at a halt through the slit 36 of the shutter 35 which is moving and wound up on the take-up reel 7 by its rotation in the direction of arrow H. When the cover tape 1b is being wound up, the rocking draw-out lever 48 rocks in the direction of arrow I to cause the rocking roller 49 to move from the state of (a) to (b) in FIG. 6, so that the length of the cover tape 1b between the both fixed rollers 52a, 52b becomes greater. Thus, while the component carrying tape 1 is at a halt, the shutter 35 retracts backwards from the component feeding position 30 thereby enabling the component 5 to be taken out, and the cover tape 1b over the recess 1c of the component carrying tape 1 positioned before the component feeding position 30 is peeled off while its upper part is covered by the shutter 35.

Next, the press-down shaft 45 is pressed down by another press-down means (not shown), by which the push-up pin 43 is pushed upwards in the direction of arrow M as shown in FIGS. 5(b) to (c), thrusting up the component 5 in the recess 1c against the attracting force of the magnet 46 so that the component is picked up by the suction nozzle 10, which in turn is lifted and moved to install the component 5 on the printed board 11. The push-up pin 43 is then lowered.

Successively, when the feed lever 20 is released from the pressure from the press-down means 21, the feed lever 20 rocks back in the direction of arrow J opposite to the direction of arrow D as shown in FIG. 6(b) by the urging force of the spring 73, and at the same time the rocking lever 26 rocks back, which causes the feed wheel 16 to be driven to rotate in the direction of arrow E through the ratchet mechanism 23 (see FIG. 3), and by the rotation of its feed toothed wheel 39, the component carrying tape 1 is fed at a pitch in the direction of arrow N shown in FIG. 5(c), so that the recess 1c in which is accommodated the next component 5 is fed to the component feeding position 30 as shown in FIG. 5(d). At the same time, as the rocking lever 26 rocks back, through the engagement between the pin 27 and the notch 38 in the shutter 35, the shutter 35 proceeds forwards in the direction of arrow O from the state (c) to (d) in FIG. 5, whereby the recess 1c of which cover tape 1b has been peeled off is moved towards the component feeding position 30 under a condition that it is kept covered by the shutter 35. Furthermore, the rocking draw-out lever 48 rocks back in the direction of arrow K in FIG. 6 so as to move the rocking roller 49 from the position shown in (b) to that in (a) of FIG.

6, so that the length of the cover tape 1b between the both fixed rollers 52a, 52b becomes smaller. This movement of the rocking roller 49 prevents the cover tape 1b from being cut between the take-up reel 7 at a halt and the proceeding shutter 35. Specifically, by this movement of the rocking roller 49, the length of the cover tape 1b between the fixed roller 52b shown in FIG. 6 and the shutter 35 is adjusted to be substantially the same under the state of (a) and that of (b), thereby avoiding a risk that the cover tape 1b is subject to a great tension and cut when the shutter 35 moves forward. One cycle of component feeding action is complete as above.

Figure 12:
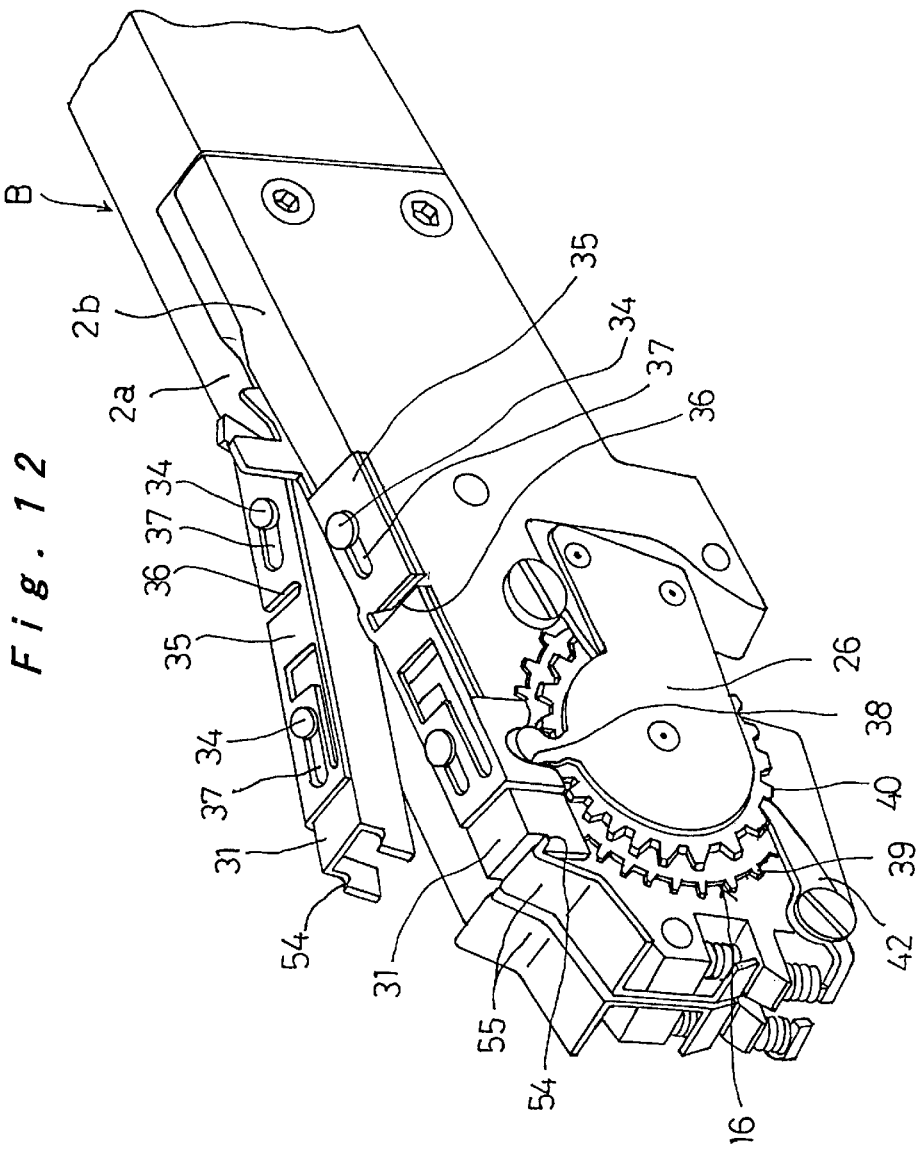
FIG. 12 is a perspective view showing major parts of the component feeding device in another embodiment of the present invention.

In the above embodiment, the component feeding device B has been described as having a single component feeding guide 2 and correspondingly a single component carrying tape 1 pitch-feed mechanism and a cover tape taking-up mechanism, but it is possible to provide a single component feeding device B with a plurality of component feeding guides 2a, 2b, as shown in FIG. 12, and with respective component carrying tape 1 pitch-feed mechanisms and cover tape taking-up mechanisms that are similar to the one described in the above embodiment.

With such an arrangement wherein a plurality of component feeding guides 2a, 2b are disposed in parallel, more types of components can be loaded in a smaller space thus facilitating manufacture of various types of products, and also, since the moving pitch of different types of components is made smaller, the speed of operation can be increased.

Moreover, in this embodiment, the slit 36 provided in the shutter (covering member) 35 for allowing the cover tape 1b to be peeled off and drawn out therethrough is formed by slitting the outer side edge of the shutter 35, so that each slit 36 opens towards the outer side. This arrangement facilitates loading operation of the component carrying tape 1, that is, for example, when setting a component carrying tape 1 in one of the component feeding devices B by picking up the distal end of the rockable holding cover 31 upwards and by disposing the component carrying tape 1 such as to run on the component feeding guide 2a, and when passing the cover tape 1b that is peeled off through the slit 36, the other component feeding guide 2b or its holding cover 31 do not obstruct such operation in any way. The loading of the component carrying tape 1 is complete after that by winding the cover tape 1b around the take-up reel 7 and then by closing the holding cover 31; a component carrying tape can be loaded simply in a short period of time, whereby production efficiency can be enhanced.

In FIG. 12, guide pins 34 and elongated holes 37 are provided respectively on the holding covers 31 and the top surface of shutters 35 in order to reduce the pitch distance between the two component feeding guides 2a, 2b. Furthermore, locking portions 54 are provided at the distal end of the holding covers 31 and locking hooks 55 at the distal end of the component feeding guides 2a, 2b, so as to lock the holding covers 31 in a closed position.

Although the slit 36 is formed in the shutter 35 in the embodiment shown in FIG. 12, this embodiment can be also applied to a component feeding device B wherein the slit 36 is formed in the holding cover (covering member) 31.

INDUSTRIAL APPLICABILITY

As set forth above, with the component feeding method and device according to the present invention wherein a component carrying tape is fed at a predetermined pitch towards a component feeding position and the cover tape is peeled off before the component feeding position, whereby the component is taken out from an accommodating space of the component carrying tape and fed at the component feeding position, the component is prevented from being displaced and is correctly picked up, by which highly reliable mounting operation can be realized.

What is claimed is:

1. A component feeding apparatus wherein a component carrying tape (1) constituted by a tapelike member (1a) having accommodating spaces (1c) formed at a predetermined pitch in a lengthwise direction of the tapelike member for accommodating components (5) therein, the components being covered by a cover tape (1b), is fed at a predetermined pitch and the cover tape (1b) is peeled off before a component feeding position (30), whereby a component (5) is taken out from the accommodating space (1c) thereof and fed at the component feeding position (30), characterized by having:

a shutter (35) movable between a position where it covers the upper surface of the component carrying tape (1) at the component feeding position (30) and a position where it opens the component feeding position (30), the shutter (35) being provided with a slit (36) through which the cover tape (1b) peeled off from the component carrying tape (1) is passed and drawn out, the shutter (35) includes a dry lubricating layer for contacting the cover tape;

peeling-off and taking-up means (7, 48) including a rocking draw-out lever (48) for pulling the cover tape (1b) drawn out through the slit (36) so as to peel off the cover tape (1b) from the component carrying tape (1) and for winding up the peeled-off cover tape (1b); and a rocking roller (49) that is movable for holding the cover tape (1b) that has been peeled off such as to give some play to the cover tape (1b) so that the cover tape (1b) will not be severed when the shutter (35) moves in a closing direction.

2. The component feeding apparatus of claim 1 further including a feeding guide member (2) for supporting the shutter (35), the feeding guide member (2) mounting a magnetic member (46) adjacent the shutter (35).

3. The component feeding apparatus of claim 1 further including a feeding guide member (2) and a push-up pin (43) movable mounted in the feeding guide member (2), the push-up pin (43) has a flat contact surface of approximately $0.125^2$ mm in area.

4. A component feeding apparatus wherein a component carrying tape (1) constituted by a tapelike member (1a) having accommodating spaces (1c) formed at a predetermined pitch in a lengthwise direction of the tape like member for accommodating components (5) therein, the components being covered by a cover tape (1b), is fed at a predetermined pitch and the cover tape (1b) is peeled off before a component feeding position (30), whereby a component (5) is taken out from the accommodating space 91c) thereof, and fed at the component feeding position (30), characterized by having:

a shutter (35) movable between a position where it covers the upper surface of the component carrying tape (1) at the component feeding position (30) and a position where it opens the component feeding position (30) the shutter (35) being provided with a slit (36) through which the cover tape (1b) peeled off from the component carrying tape (1) is passed and drawn out; and peeling off and taking-off means (7, 48) for pulling the cover tape (1b) drawn out through the slit (36) so as to peel off the cover tape (1b) from the component carrying tape (1) and for winding up the peeled-off cover tape (1b), wherein the shutter (35) is provided with a dry tape lubricating layer on sliding surfaces thereof.

5. A component feeding apparatus wherein a component carrying tape (1) constituted by a tapelike member (1a) having accommodating spaces (1c) formed at a predetermined pitch in a lengthwise direction of the tapelike member for accommodating components (5) therein, the components being covered by a cover tape (1b), is fed at a predetermined pitch and the cover tape (1b) is peeled off before a component feeding position (30), whereby a component (5) is taken out from the accommodating space (1c) thereof and fed at the component feeding position (30), characterized by having:

a shutter (35) movable between a position where it covers the upper surface of the component carrying tape (1) at the component feeding position (30) and a position where it opens the component feeding position (30), the shutter (35) being provided with a slit (36) through which the cover tape (1b) peeled off from the component carrying tape (1) is passed and drawn out;

peeling-off and taking-up means (7, 48) for pulling the cover tape (1b) drawn out through the slit (36) so as to peel off the cover tape (1b) from the component carrying tape (1) and for winding up the peeled-off cover tape (1b); and a push-up pin (43) provided at the component feeding position (30) for pushing up from below the component (5) in the accommodating space (1c) of the component carrying tape (1); wherein the push-up pin (43) is formed with a flat surface (53) at the upper end thereof of a diameter to a degree that it is capable of piercing through the bottom surface of the accommodating space (1c) of the component carrying tape (1), wherein the shutter (35) includes a dry lubricating layer for contacting the cover tape.

6. The component feeding apparatus of claim 5 further including a feeding guide member (2) for supporting the shutter (35), and feeding guide member (2) mounting a magnetic source member (46) adjacent the shutter (35).

7. The component feeding apparatus of claim 5 further including a feeding guide member (2) and the push-up pin (43) is movably mounted in the feeding guide member (2), the push-up pin (43) has a flat contact surface of approximately 0.125 mm$^2$ in area.

8. The component feeding apparatus of claim 5 further including a pair of rotatable, fixed rollers (52a, 52b) contacting the cover tape and a movable roller (49) positioned between the fixed rollers and moving relative to the fixed rollers to draw the cover tape between the fixed rollers, wherein the movement of the movable roller is coordinated with the predetermined pitch length and movement of the shutter member to remove the cover tape.

* * * * *